United States Patent
Miao et al.

(10) Patent No.: US 12,132,134 B2
(45) Date of Patent: Oct. 29, 2024

(54) RETINOMORPHIC SENSOR ARRAY AND IMAGE CONVOLUTION METHOD THEREFOR

(71) Applicant: NANJING UNIVERSITY, Nanjing (CN)

(72) Inventors: Feng Miao, Nanjing (CN); Shijun Liang, Nanjing (CN); Chenyu Wang, Nanjing (CN)

(73) Assignee: NANJING UNIVERSITY, Nanjing (CN)

( * ) Notice: Subject to any disclaimer, the term of this patent is extended or adjusted under 35 U.S.C. 154(b) by 0 days.

(21) Appl. No.: 17/769,609

(22) PCT Filed: Mar. 26, 2020

(86) PCT No.: PCT/CN2020/081313
§ 371 (c)(1),
(2) Date: Apr. 15, 2022

(87) PCT Pub. No.: WO2021/184407
PCT Pub. Date: Sep. 23, 2021

(65) Prior Publication Data
US 2024/0136461 A1   Apr. 25, 2024
US 2024/0234617 A9   Jul. 11, 2024

(30) Foreign Application Priority Data

Mar. 17, 2020   (CN) .......................... 202010189068.4

(51) Int. Cl.
*H01L 31/113* (2006.01)
*H01L 31/0224* (2006.01)
*H01L 31/18* (2006.01)
*H04N 25/47* (2023.01)
*H01L 31/032* (2006.01)

(52) U.S. Cl.
CPC .. *H01L 31/1136* (2013.01); *H01L 31/022408* (2013.01); *H01L 31/18* (2013.01); *H04N 25/47* (2023.01); *H01L 31/032* (2013.01)

(58) Field of Classification Search
CPC ......... H01L 31/1136; H01L 31/022408; H01L 31/18; H01L 31/032; H04N 25/47
See application file for complete search history.

(56) References Cited

U.S. PATENT DOCUMENTS

| | | | |
|---|---|---|---|
| 11,616,453 B2 * | 3/2023 | Shimizu | H01L 29/786 363/17 |
| 2010/0155707 A1 * | 6/2010 | Anthopoulos | B82Y 10/00 257/E51.027 |
| 2019/0338070 A1 * | 11/2019 | Wang | C08G 61/126 |

* cited by examiner

*Primary Examiner* — Yogesh K Aggarwal
(74) *Attorney, Agent, or Firm* — CBM PATENT CONSULTING, LLC

(57) ABSTRACT

A retinomorphic sensor array and a convolution method are used for image processing therefor, wherein the optoelectronic sensor has a vertically stacked heterostructure provided with a bottom electrode, a dielectric layer, a channel layer, a source electrode and a drain electrode on a base, the source and drain electrode are mutually opposite and are arranged at two ends of the channel layer, the bottom electrode, the source and drain electrode are made of a material used by a flexible electrode, an inert metal or a semimetal, the dielectric layer is made of an insulating material, the channel layer is made of a bipolar material, and the base comprises a substrate and an insulating material layer generated on a surface of the substrate.

10 Claims, 8 Drawing Sheets

RETINOMORPHIC SENSOR ARRAY AND IMAGE CONVOLUTION METHOD THEREFOR

TECHNICAL FIELD

The present invention relates to a crossed field of optoelectronic sensors, vision chips, artificial neural networks and semiconductor fabrication technologies, in particular to a retinomorphic optoelectronic device, a fabrication method thereof, an optoelectronic sensor array with the optoelectronic device and an application of the optoelectronic sensor array in the applications of process and recognition for inputted images.

BACKGROUND

A visual system is the main way for humans to perceive external information. Studies have shown that the amount of information transmitted through the visual system can account for more than 80% of a total amount of perceived information. Therefore, researchers have explored a direction of computer vision by modeling the vision system and using computers to further perform its functions. Since the 1960s, computer vision has developed rapidly, and is widely applied to various fields such as fabrication, medical treatment, military and security. In specific fields, computer vision has achieved results comparable to, or even better than, those of humans.

However, a natural biological vision system still has great advantages in function and efficiency. For example, the human visual system has a property of auto-adapting to environments with different brightness, and has a detected brightness range spanning 9 orders of magnitude ($10^{-3}$-$10^6$ cd/m$^2$); the human eyes can quickly and automatically track a target which is deviating through the control movement of eyeballs; visual information (equivalent to high-definition images with more than 100 million pixels) generated at retina can be transmitted to a visual cortex with low delay and correctly decoded by utilizing the sparse coding function of visual ganglion cells; the learning ability of small samples can enable the visual system to quickly learn the characteristics of the samples and realize recognition after inputting a few image samples; when the above functions are realized, the power consumption of the human brain is 20 W, the working frequency is as low as 10 Hz, and the power density is only one thousandth of that of the existing general processor. Therefore, in order to further combine the advantages of the human visual system with the existing computer vision results, researchers have proposed a concept of "neuromorphic vision chip" aiming at applying great advantages of the chip in function and power consumption to the computer vision field through the simulation of the structure and function of the human visual system.

The computer vision field emerges in the early development stage of the very-large-scale integrated circuit. Professor Carver Andress Mead of California Institute of Technology firstly proposes that the early processing process of visual information occurred in retina can be simulated by designing a special CMOS integrated circuit to improve the information processing efficiency. The research team led by the professor Mead successfully simulates photoreceptors and bipolar cells in retina by using a honeycomb circuit structure, and realizes functions such as edge recognition, and large-range brightness response; in addition, the vision system closely combines the signal acquisition and early processing, stratifies post-processing, and has also been used for reference and forming a computing architecture integrating signal acquisition, storage and processing; since the beginning of the 21$^{st}$ century, with reference to the information processing mode of the visual system, the researchers have proposed two information processing driving modes (frame driving mode and event driving mode) to achieve a more efficient neuromorphic visual processing system.

However, this field also faces many problems, for example, simulating cells in the retina with a CMOS-based integrated circuit results in increased circuit complexity, decreasing fill factors of the vision chip; the rapidly developed 3D integrated circuits still cannot produce a vertical layered structure similar to the retina; the existing computing architecture cannot be compared with a biological vision system in power consumption. Furthermore, the sensor and the processor in the current neuromorphic vision system are separated, and the recognition of the target finally needs to be completed on a specific accelerator. There is no photodetector at present, which not only can sense and process visual information at the same time, but also has the abilities of learning and inference, and can recognize a target in real time.

SUMMARY

Objective: In order to solve the defects in the prior art, the present invention provides a retinomorphic sensor, a fabrication method therefor and an optoelectronic sensor array having the optoelectronic device, which solve the problems of a complicated circuit and high power consumption caused by simulating cells in the retina, and a low processing speed and the separation of an optoelectronic sensor and a visual information processor as well as an artificial neural network caused by the separation of a sensor and a processor.

Technical scheme: The retinomorphic optoelectronic device provided by the present invention has a vertically stacked heterostructure provided with a bottom electrode, a dielectric layer, a channel layer, a source electrode and a drain electrode on a base, the source and drain electrode are mutually opposite and are arranged at two ends of the channel layer, the bottom electrode, the source and drain electrode are made of a material used by a flexible electrode, an inert metal or a semimetal, the dielectric layer is made of an insulating material, the channel layer is made of a bipolar material, and the base comprises a substrate and an insulating material layer generated on a surface of the substrate.

Further,
the substrate is of a material comprising silicon, polyimide or polydimethylsiloxane, and the insulating material layer generated on the surface of the substrate is silicon oxide, aluminum oxide, hafnium zirconium oxygen or boron nitride.

Further,
the bipolar material of the channel layer is graphene, tungsten selenide, molybdenum telluride, black phosphorus or palladium selenide.

Further,
the dielectric layer is made of any one or more of boron nitride, silicon oxide, aluminum oxide and hafnium zirconium oxygen.

The fabrication method for the retinomorphic optoelectronic device provided by the present invention comprises:
S1, preparing the bottom electrode on a surface of the base;
S2, directly obtaining the dielectric layer on the bottom electrode, or firstly obtaining dielectric layer materials on the bottom electrode, and then vertically stacking various dielectric layer materials by using a material transfer method to prepare the dielectric layer having a multilayer structure;

S3, performing direct generation of the bipolar material of the channel layer on the dielectric layer; or firstly obtaining the bipolar material of the channel layer, and then transferring the bipolar material onto the dielectric layer by using a material transfer method to form the channel layer; and S4, preparing the source and drain electrode on a surface of the channel layer.

Further, in the S2, the method for directly obtaining the dielectric layer on the bottom electrode is a chemical vapor deposition method, a chemical vapor transport method, a molecular-beam epitaxy method, an atomic layer deposition method or a hydrothermal method.

Further, in the S3, the method for performing the direct generation of the bipolar material of the channel layer on the dielectric layer is a chemical vapor deposition method, a chemical vapor transport method, a molecular-beam epitaxy method, an atomic layer deposition method or a hydrothermal method.

Further, in the S1, the method for preparing the bottom electrode on a surface of the base comprises:

S11, preparing a designed bottom electrode shape on the substrate by adopting an ultraviolet photo lithography method, an electron beam lithography method or a mask method; and S12, preparing the bottom electrode.

The retinomorphic sensor array provided by the present invention has the retinomorphic sensor described above.

The visual convolution method for image processing implemented according to the retinomorphic sensor array provided by the present invention comprises:

(1) arranging bit lines in each optoelectronic device of the optoelectronic sensor array, connecting the bit lines corresponding to the optoelectronic devices in each row in series, arranging signal lines on each optoelectronic device, connecting the signal lines corresponding to the optoelectronic devices in each column in series, and applying, by the bit lines and the signal lines, source and drain voltages to the optoelectronic sensor at a specific position in the array;

(2) arranging word lines in each optoelectronic device of the optoelectronic sensor array for applying a back-gate voltage to a specific row of the optoelectronic sensors in the array;

(3) inputting corresponding voltages for the crossed optoelectronic sensors in a specific column by using the bit lines and the word lines, meanwhile, inputting the back-gate voltage to corresponding optoelectronic devices through the word lines, completing partial convolution operation, and outputting a result, i.e., $$I_m = P_{11} \times G_{11}(V_g^{11}) + P_{21} \times G_{21}(V_g^{21}) + \ldots + P_{m1} \times G_{m1}(V_g^{m1})$$

wherein $V_g^{m1}$ is a back-gate voltage of an $m^{th}$ row and a $1^{st}$ column, $P_{m1}$ is a visual image information input of an optoelectronic device on the $m^{th}$ row and the $1^{st}$ column, $G_{m1}(V_g^{m1})$ is photo responsivity of the $m^{th}$ row and the $1^{st}$ column, and the m is a total number of rows of convolution kernels; and (4) completing convolution operation of the whole optoelectronic sensor array by using an m×m convolution kernel according to the method in the step (3).

The visual image recognition method implemented according to the bionic retinomorphic sensor array provided by the present invention comprises:

step 1, inputting information to be recognized into the optoelectronic sensor array, and setting back-gate voltages of all optoelectronic devices to be 0 V;

step 2, acquiring an output current I of the optoelectronic sensor array, and inputting the output current into the following Sigmoid activation function:

$$f = (1 + e^{-\alpha I})^{-1}$$

wherein I is the output current of the optoelectronic sensor array, and α is a normalization coefficient;

step 3, after calculating a value of the activation function $f$, comparing the value with a target value, then determining and executing error back propagation operation according to the following equation:

$$\delta^k = f_g^k - f^k$$

wherein $\delta^k$ is an error used in a $k^{th}$ training, $f_g^k$ is a theoretical output value in the $k^{th}$ training, and $f^k$ is an output value of the Sigmoid activation function in the $k^{th}$ training;

step 4, after the error is transmitted to a first layer, updating an initial back-gate value in the optoelectronic sensor array through the following functional relationship:

$$\Delta V_g^k = \beta \times \text{round}(n^{-1} \times \text{conv}(P, \delta^k))$$

wherein n is a step length, β is a step length of a gate voltage change, P is an input of visual image information, round is a rounding function, and cony is a convolution function, and thus a training process is completed; and step 5, looping the steps 1-4 until the error calculated in the step 3 is close to or equal to 0, that is, a target image is successfully recognized from all the inputted images.

Beneficial effects: 1. The present invention designs a brand-new retinomorphic sensor, better simulates cell functions of a human visual system, optimizes the device performance and reduces the circuit complexity by using the physical characteristics of a new material; 2. the optoelectronic sensor array provided by the present invention can realize the convolutional neural network for simultaneously sensing, processing and visual information recognition, and the optoelectronic device can be reconstructed into different convolutional neural networks by adjusting the gate voltage of each pixel device in the optoelectronic device, so that the operation and recognition of different processing of the visual information can be realized, and the recognition method is simple; 3. the reconfigurable artificial retinomorphic sensor for simultaneous sensing, information processing and recognition of image information can be further integrated into a retinomorphic optical sensing chip for using in real-time application scenes of edge calculation such as intelligent security and health care.

DETAILED DESCRIPTION

Figure 1:
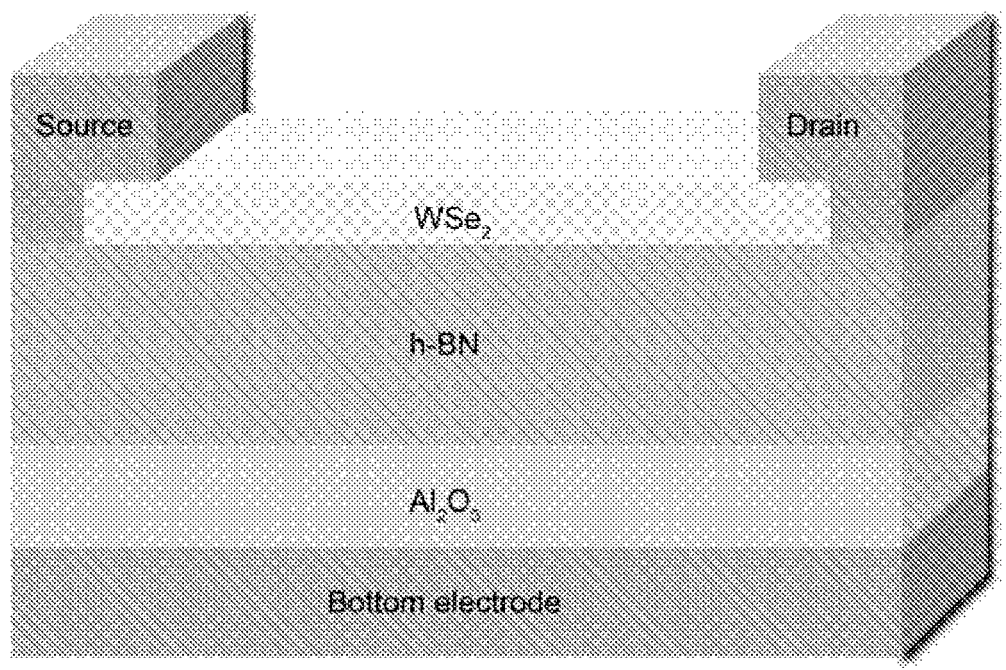
FIG. 1 is a schematic structural diagram of the optoelectronic device in Example 2 according to the present invention.

Firstly, the present invention discloses a retinomorphic optoelectronic device and a fabrication method therefor, and the bionic optoelectronic device has a vertically stacked heterostructure provided with a bottom electrode, a dielectric layer, a channel layer, a source electrode and a drain electrode on a base, the source and drain electrode are mutually opposite and are arranged at two ends of the channel layer, the bottom electrode, the source and drain electrode are made of a material used by a flexible electrode, an inert metal or a semimetal, the dielectric layer is made of an insulating material, the channel layer is made of a bipolar material, and the base comprises a substrate and an insulating material layer generated on a surface of the substrate.

The substrate material can be silicon, polyimide or polydimethylsiloxane, and the insulating material layer generated on the surface of the substrate is silicon oxide, aluminum oxide, hafnium zirconium oxygen or boron nitride.

The dielectric layer can be made of one or more of boron nitride, silicon oxide, aluminum oxide, hafnium zirconium oxide, and the like, thereby forming a vertical heterostructure.

The bipolar material of the channel layer has bipolar electrical characteristics, that is, the bipolar material can be an n-type doping materials or a p-type doping material by the field effect modulation, and comprises graphene, tungsten selenide, molybdenum telluride, black phosphorus or palladium selenide.

The bottom electrode and the source and drain electrodes are made of an inert metal, a flexible electrode or a semimetal, such as platinum, gold, palladium, indium tin oxide and graphene.

Secondly, the present invention also discloses a fabrication method for the retinomorphic optoelectronic device, and the method comprises:

S1, preparing the bottom electrode on a surface of the base;

the electrode material is a conductive material such as an inert metal and titanium nitride which can be prepared by physical vapor deposition, magnetron sputtering and other methods, or a semimetal-type two-dimensional atomic crystal such as graphene, and the preparation methods of the electrodes made of the two materials are slightly different.

Firstly, for the conductive material prepared by physical vapor deposition or magnetron sputtering and other methods, the specific preparation steps thereof comprise:

(1) spin-coating a layer of photoresist on a substrate, exposing a self-defined electrode pattern at a specified position on the substrate by using electron beam lithography or ultraviolet photo lithography (the required electrode pattern is exposed, and the rest part is covered by the photoresist), and developing the pattern by using a developer;

(2) generating a layer of conductive material thin film on the substrate with the prepared pattern by using electron beam evaporation, thermal evaporation or magnetron sputtering, wherein the used material is an inert metal such as gold, platinum and palladium, or a conductive compound such as titanium nitride; and (3) placing the substrate into an acetone solution, dissolving the redundant photoresist by using the acetone, wherein the conductive material thin film on the surface of the redundant photoresist can fall off from the substrate, and the conductive thin film electrode with the designed pattern is left on the substrate.

Secondly, for semimetal-type two-dimensional atomic crystals, the specific preparation steps thereof comprise:

firstly, selecting a single-layer, multi-layer or thick-layer semimetal-type two-dimensional atomic crystal thin film prepared on a substrate, spin-coating a layer of photoresist, exposing a self-defined electrode pattern at a specified position on graphene by using electron beam lithography or ultraviolet photo lithography (the required electrode pattern is covered by the photoresist, and the rest part is exposed), and developing the pattern by using a developer;

then, etching the redundant semimetal-type two-dimensional atomic crystals by using plasma etching, and leaving the semimetal-type two-dimensional atomic crystal of the required electrode pattern covered by the photoresist;

placing the substrate into an acetone solution, dissolving residual photoresist by using acetone, and leaving a semi-metal type two-dimensional atomic crystal thin film electrode with the designed pattern on the substrate;

finally, transferring the prepared semimetal-type two-dimensional atomic crystal thin film electrode to a required position on a sample.

S2, directly obtaining the dielectric layer on the bottom electrode, or firstly obtaining dielectric layer materials on the bottom electrode, and then vertically stacking various dielectric layer materials by using a material transfer method to prepare the dielectric layer having a multilayer structure;

specifically, the dielectric layer is made of an insulating material including boron nitride, silicon oxide, aluminum oxide, hafnium zirconium oxygen, and the like.

The dielectric layer can be directly obtained by methods such as chemical vapor deposition (CVD), chemical vapor transport (CVT), molecular beam epitaxy (MBE), atomic layer deposition (ALD), magnetron sputtering and hydrothermal method;

the dielectric layer can be also obtained by firstly obtaining topological materials by a chemical vapor transport (CVT) method and then obtaining stratification materials by methods such as mechanical exfoliation or ultrasonic spin coating;

the dielectric layer may be made of only one material, or a heterojunction dielectric layer having a multi-layer structure in a vertical direction may be obtained by a transfer method after obtaining the corresponding material. The dielectric layer can be directly generated on the surface of the bottom electrode, and can also be transferred to an upper surface of the bottom electrode from other substrates by a transfer method.

S3, performing the direct generation of the bipolar material of the channel layer on the dielectric layer; or firstly obtaining the bipolar material of the channel layer, and then transferring the bipolar material onto the dielectric layer by using a material transfer method to form the channel layer.

Specifically, the channel layer is made of bipolar materials, including tungsten selenide, molybdenum telluride, black phosphorus, graphene, palladium selenide and the like. The channel layer can be directly obtained by methods such as chemical vapor deposition (CVD), molecular beam epitaxy (MBE), atomic layer deposition (ALD), magnetron sputtering and hydrothermal method; the channel layer can be also obtained by firstly obtaining topological materials by a chemical vapor transport (CVT) method and then obtaining stratification materials by methods such as mechanical exfoliation or ultrasonic spin coating; the dielectric layer can be directly generated on the surface of the bottom electrode, and can also be transferred onto an upper surface of the bottom electrode from other substrates by a transfer method.

Any type of electrode material, dielectric material, and channel material may be used in the present invention, as conditions permit. The term "conditional permission" as used herein means that certain limited conditions need to be met, for example, the electrode material, the dielectric material and the channel material cannot be dissolved in water, acetone or photoresist; and the electrode material, the dielectric material and the channel material are not chemically reactive with water, acetone and photoresist. It is understood by those skilled in the art that the electrode material in the present invention may be other metallic or semi-metallic materials, the dielectric material in the present invention may be other insulating materials, and the channel material may be other bipolar materials, as the limited conditions are met.

S4, preparing the source and drain electrode on a surface of the channel layer.

The materials and preparation methods for the source and drain electrode are the same as those of the bottom electrode, and are not described again.

The present invention provides a plurality of examples for fabricating optoelectronic devices specifically comprising:

Example 1

The preparation method for a metal bottom electrode comprises: firstly, spin-coating a layer of polymethyl methacrylate (PMMA) on a substrate by a spin coater, exposing a designated electrode pattern on the PMMA by using an electron beam exposure method, and exposing the electrode pattern by using a developer so as to expose the underlying substrate; then, generating a metal thin film with a thickness of about 40 nm on the PMMA and the substrate by electron beam evaporation; and finally, placing the PMMA and the substrate into an acetone solution together to dissolve the PMMA, so as to take away the redundant metal thin film. The metal film bottom electrode with the designated shape is left on the substrate.

The preparation method for a dielectric layer comprises: firstly, generating an alumina thin film with a thickness of about 10 nm on a substrate with a bottom electrode by using atomic layer deposition; then, obtaining a thin layer of hexagonal boron nitride with a thickness of 5-50 nm by using a mechanical exfoliation method; and transferring the thin layer of hexagonal boron nitride to a surface of the alumina thin film by using a transfer method, thereby forming the alumina/hexagonal boron nitride heterostructure dielectric layer.

The preparation method for a channel layer comprises: directly preparing a thin layer of tungsten selenide on a surface of a dielectric layer by using a chemical vapor deposition (CVD) method.

Preparation of source and drain electrodes: the source and drain electrodes are prepared in the same method as the bottom electrode mentioned above, but the source and drain electrodes must have an overlapping region with the bottom electrode in a horizontal direction, and the materials of the channel layer is ensured to be between the source and drain electrodes.

Example 2

Figure 2:
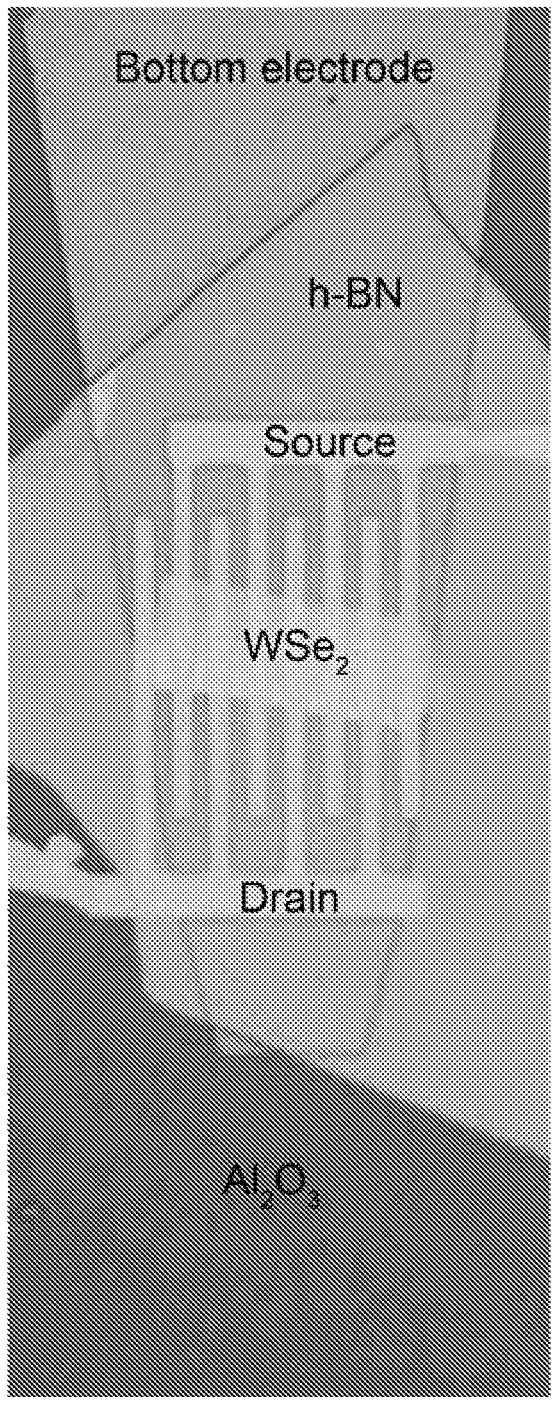
FIG. 2 is an optical image of the optoelectronic device in Example 2 according to the present invention.

As shown in FIGS. 1 and 2, the preparation method for a metal bottom electrode comprises: firstly, spin-coating a layer of polymethyl methacrylate (PMMA) on a substrate by a spin coater, exposing a designated electrode pattern on the PMMA by using an electron beam exposure method, and exposing the electrode pattern by using a developer so as to expose the underlying substrate; then, generating a metal thin film with a thickness of about 40 nm on the PMMA and the substrate by electron beam evaporation; and finally, placing the PMMA and the substrate into an acetone solution together to dissolve the PMMA, so as to take away the redundant metal thin film. The metal film bottom electrode with the designated shape is left on the substrate.

The preparation method for a dielectric layer comprises: firstly, generating an alumina thin film ($Al_2O_3$) with a thickness of about 10 nm on a substrate with a bottom electrode by using atomic layer deposition; then, obtaining a thin layer of hexagonal boron nitride (h-BN) with a thickness of 5-50 nm by using a mechanical exfoliation method; and transferring the thin layer of hexagonal boron nitride to a surface of the alumina thin film by using a transfer method, thereby forming the alumina/hexagonal boron nitride heterostructure dielectric layer.

The preparation method for a channel layer comprises: firstly obtaining a thin layer of tungsten selenide ($WSe_2$) by using a mechanical exfoliation method, and then transferring the thin layer of tungsten selenide to a surface of a dielectric layer.

Preparation of source and drain electrodes: the source electrode is represented as Source and the drain electrode is presented as Drain; the source and drain electrodes are prepared in the same method as the bottom electrode mentioned above, but the source and drain electrodes must have an overlapping region with the bottom electrode in a horizontal direction, and the materials of the channel layer is ensured to be between the source and drain electrodes.

Example 3

The preparation method for a metal bottom electrode comprises: firstly, spin-coating a layer of PMMA on a substrate by a spin coater, exposing a designated electrode pattern on the PMMA by using an electron beam exposure method, and exposing the electrode pattern by using a developer so as to expose the underlying substrate; then, generating a metal thin film with a thickness of about 40 nm on the PMMA and the substrate by electron beam evaporation; and finally, placing the PMMA and the substrate into an acetone solution together to dissolve the PMMA, so as to take away the redundant metal thin film. The metal film bottom electrode with the designated shape is left on the substrate.

The preparation method for a dielectric layer comprises: firstly, generating an alumina thin film with a thickness of about 5-50 nm on a substrate with a bottom electrode by using atomic layer deposition.

The preparation method for a channel layer comprises: directly preparing a thin layer of tungsten selenide on a surface of a dielectric layer by using a chemical vapor deposition (CVD) method.

Preparation of source and drain electrodes: the source and drain electrodes are prepared in the same method as the bottom electrode mentioned above, but the source and drain electrodes must have an overlapping region with the bottom electrode in a horizontal direction, and the materials of the channel layer is ensured to be between the source and drain electrodes.

Example 4

The preparation method for a metal bottom electrode comprises: firstly, spin-coating a layer of PMMA on a substrate by a spin coater, exposing a designated electrode pattern on the PMMA by using an electron beam exposure method, and exposing the electrode pattern by using a developer so as to expose the underlying substrate; then, generating a metal thin film with a thickness of about 40 nm on the PMMA and the substrate by electron beam evaporation; and finally, placing the PMMA and the substrate into an acetone solution together to dissolve the PMMA, so as to take away the redundant metal thin film. The metal film bottom electrode with the designated shape is left on the substrate.

The preparation method for a dielectric layer comprises: firstly, generating an alumina thin film with a thickness of about 5-50 nm on a substrate with a bottom electrode by using atomic layer deposition.

The preparation method for a channel layer comprises: firstly obtaining a thin layer of tungsten selenide by using a mechanical exfoliation method, and then transferring the thin layer of tungsten selenide to a surface of a dielectric layer.

Preparation of source and drain electrodes: the source and drain electrodes are prepared in the same method as the bottom electrode mentioned above, but the source and drain electrodes must have an overlapping region with the bottom electrode in a horizontal direction, and the materials of the channel layer is ensured to be between the source and drain electrodes.

Example 5

The preparation method for a metal bottom electrode comprises: firstly, spin-coating a layer of PMMA on a substrate by a spin coater, exposing a designated electrode pattern on the PMMA by using an electron beam exposure method, and exposing the electrode pattern by using a developer so as to expose the underlying substrate; then, generating a metal thin film with a thickness of about 40 nm on the PMMA and the substrate by electron beam evaporation; and finally, placing the PMMA and the substrate into an acetone solution together to dissolve the PMMA, so as to take away the redundant metal thin film. The metal film bottom electrode with the designated shape is left on the substrate.

The preparation method for a dielectric layer comprises: obtaining a thin layer of hexagonal boron nitride with a thickness of 5-50 nm by using a mechanical exfoliation method; and transferring the thin layer of hexagonal boron nitride to a surface of the alumina thin film by using a transfer method.

The preparation method for a channel layer comprises: directly preparing a thin layer of tungsten selenide on a surface of a dielectric layer by using a chemical vapor deposition (CVD) method.

Preparation of source and drain electrodes: the source and drain electrodes are prepared in the same method as the bottom electrode mentioned above, but the source and drain electrodes must have an overlapping region with the bottom electrode in a horizontal direction, and the materials of the channel layer is ensured to be between the source and drain electrodes.

Example 6

The preparation method for a metal bottom electrode comprises: firstly, spin-coating a layer of PMMA on a substrate by a spin coater, exposing a designated electrode pattern on the PMMA by using an electron beam exposure method, and exposing the electrode pattern by using a developer so as to expose the underlying substrate; then, generating a metal thin film with a thickness of about 40 nm on the PMMA and the substrate by electron beam evaporation; and finally, placing the PMMA and the substrate into an acetone solution together to dissolve the PMMA, so as to take away the redundant metal thin film. The metal film bottom electrode with the designated shape is left on the substrate.

The preparation method for a dielectric layer comprises: obtaining a thin layer of hexagonal boron nitride with a thickness of 5-50 nm by using a mechanical exfoliation method; and transferring the thin layer of hexagonal boron nitride to a surface of the alumina thin film by using a transfer method.

The preparation method for a channel layer comprises: firstly obtaining a thin layer of tungsten selenide by using a mechanical exfoliation method, and then transferring the thin layer of tungsten selenide to a surface of a dielectric layer.

Preparation of source and drain electrodes: the source and drain electrodes are prepared in the same method as the bottom electrode mentioned above, but the source and drain electrodes must have an overlapping region with the bottom electrode in a horizontal direction, and the materials of the channel layer is ensured to be between the source and drain electrodes.

The optoelectronic device fabricated in Example 1 has the same structure as the optoelectronic device fabricated in Examples 3-6, the materials used in Example 1 are different from those used in the Examples 3-6, and these materials are not illustrated in the drawings.

Figure 3A:
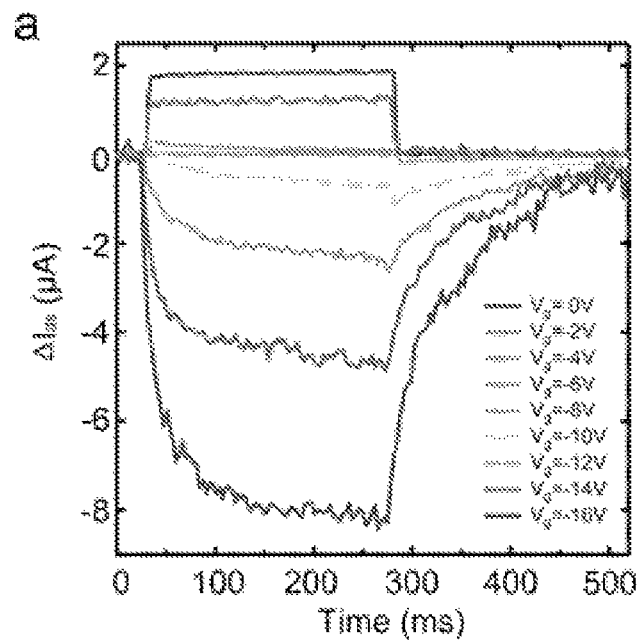
FIG. 3A is a graph showing the change of the photoresponse of the device with the back-gate voltage when light intensity is unchanged.
Figure 3B:
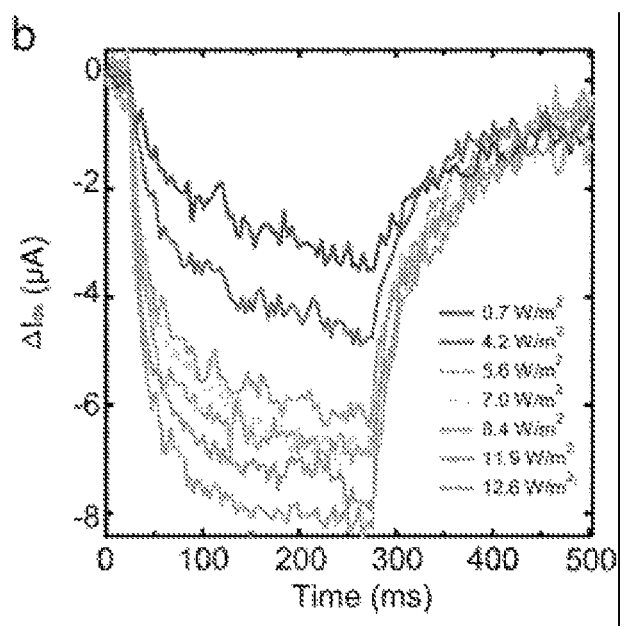
FIG. 3B is a graph showing the change of the photocurrent of the device with the light intensity when the back gate is unchanged.
Figure 3C:
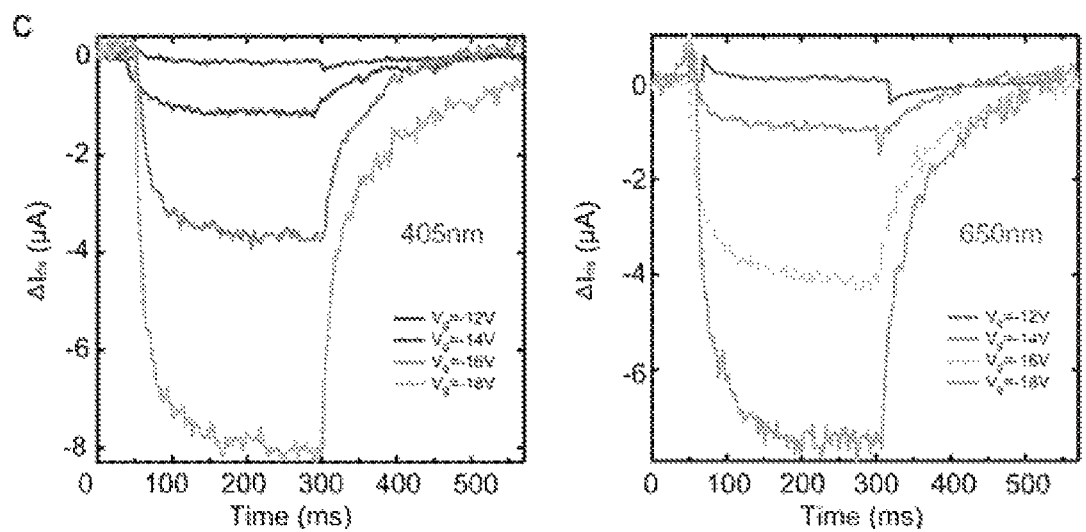
FIG. 3C shows the photoresponse characteristics of devices with different optical wavelengths under the same back gate.

The optoelectronic device shows different photoresponse characteristics under different back-gate voltages, light intensities and wavelengths, and the results are shown in FIG. 3A shows photoresponse characteristics of the optoelectronic device under different back-gate voltages. FIG. 3B shows photoresponse characteristics of the optoelectronic device under different light intensities. FIG. 3C show that the optoelectronic device is capable of operating over the entire visible spectral range.

A retinomorphic sensor array has the retinomorphic optoelectronic device fabricated by the above examples. The retinomorphic optoelectronic sensor chip can be fabricated by combining the edge circuit on the basis of the array.

The above-mentioned optoelectronic sensor array is formed by integrating the above-mentioned retinomorphic optoelectronic devices on a plane to form an optoelectronic sensor array. Through the design of a matched peripheral circuit, the control of the source and drain voltages and the gate voltage of any device in the array can be realized. The optoelectronic sensor array can realize the simultaneous sensing and processing of visual information, and is used for realizing a convolutional neural network. By adjusting the gate voltage of each pixel device in the optoelectronic device, the optoelectronic device can be reconstructed into different convolutional neural networks for realizing different processing and recognition of visual information.

The information processing chip is a reconfigurable artificial retinomorphic sensor integrating simultaneous sensing, information processing and recognition into a retinomorphic optical sensing chip, and further performs information processing. The information processing chip can be used for real-time application scenes of edge calculation such as intelligent security and health care.

Figure 4:
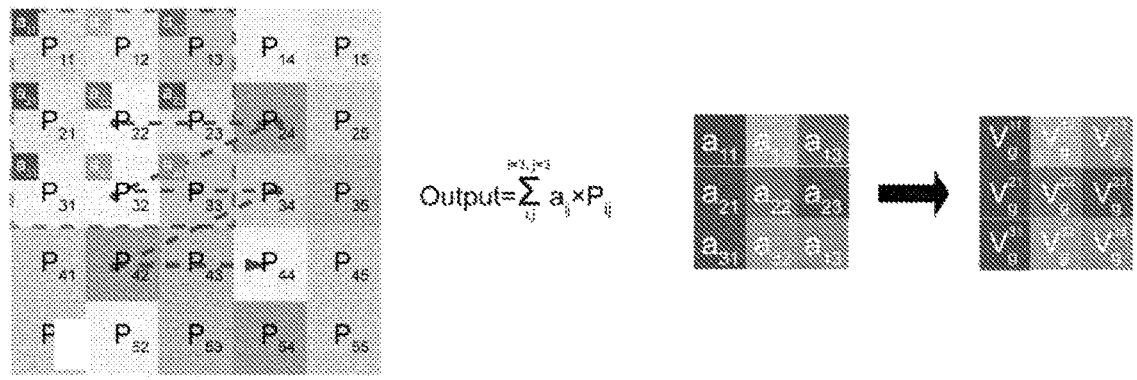
FIG. 4 is a schematic diagram of the optoelectronic sensor array of the optoelectronic device according to the present invention and a peripheral control circuitry.
Figure 4:
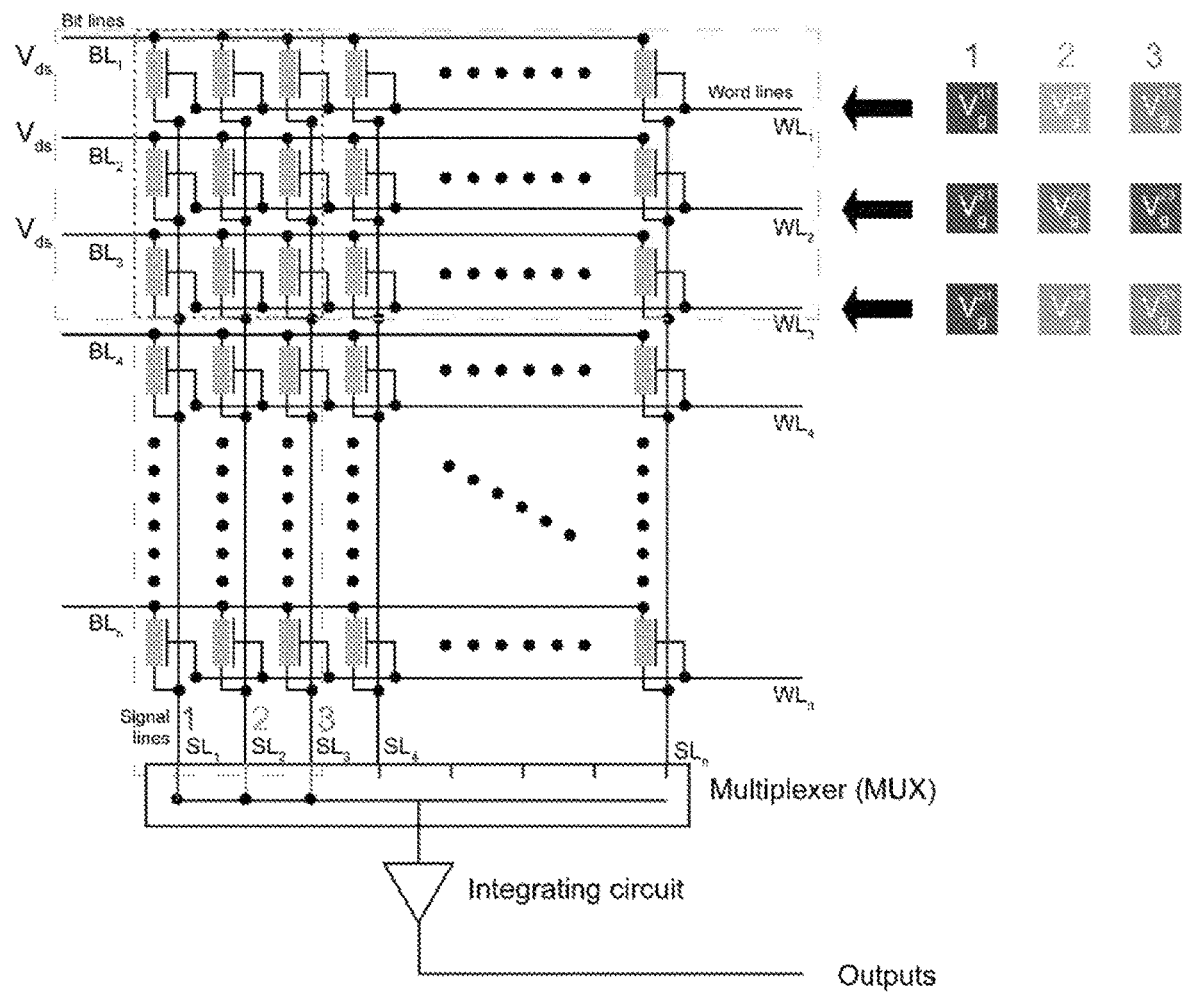

A visual convolution method for image processing implemented according to a retinomorphic sensor array is characterized in that firstly, the optoelectronic sensor array consists of optoelectronic devices fabricated according to examples, and the schematic diagram of the optoelectronic sensor array is shown in FIG. 4.

The array can complete convolution operation in image processing. For example, the convolution operation of a 3×3 convolution kernel is specifically as shown in FIG. 4a: the existing convolution kernel A:

| $a_{11}$ | $a_{12}$ | $a_{13}$ |
| $a_{21}$ | $a_{22}$ | $a_{23}$ |
| $a_{31}$ | $a_{32}$ | $a_{33}$ | and an image P. When convolution is performed, a 3×3 array is selected from the top left corner of the image P, and the pixel values of the array are multiplied by the values of the convolution kernel, the operation rule is as follows:

$$\text{Outputs} = \sum_{i,j}^{i=3,j=3} a_{ij} \times P_{ij}$$

$P_{ij}$ is a pixel value of the pixel in an $i^{th}$ row and a $j^{th}$ column of the image, and Outputs are the final convolution results.

The convolution operation includes nine multiplications and eight additions. According to the method, the convolution kernel A is continuously multiplied by the 3×3 array of the image P along the dotted arrow from the upper left corner of the image P, and the final operation result is reassembled according to the multiplication sequence, so that a new image can be obtained. This image is the result of the image P with the convolution operation of the convolution kernel A.

In order to achieve this function with the array, the photoresponse coefficients ($G_{ij}(V_g^{ij})$) of the devices in the array are mapped to matrix elements ($a_{ij}$) in the convolution kernel by manipulating the back-gate voltage $V_g^{ij}$ applied to each device in the array, as shown in FIG. 4b. $P_{ij}$ is a light intensity value representing an image pixel. Since the photocurrent ($I_{photocurrent}$) of the device is a product of the light intensity and the photo responsivity matrix, the process of the device receiving illumination and generating a photocurrent can be regarded as a multiplication operation. The addition of photocurrents generated by different devices by using Kirchhoff s law can be regarded as an addition operation by connecting a plurality of devices in series. Therefore, the whole process can be regarded as that the convolution operation is performed on the array formed by the light intensity and the array formed by the corresponding photo responsivity matrix:

$$I = \sum_{i,j} P_{ij} \times G_{ij}(V_g^{ij})$$

FIG. 4c shows how an optoelectronic sensor array of a larger-scale retinomorphic bionic optoelectronic device can perform convolution operations on images.

The convolutional operation comprises: arranging bit lines in each optoelectronic device of the optoelectronic sensor array, connecting the bit lines corresponding to the optoelectronic devices in each row in series, arranging signal lines on each optoelectronic device, connecting the signal lines corresponding to the optoelectronic devices in each column in series, and applying, by the bit lines and the signal lines, source and drain voltages to the optoelectronic device at a specific position in the array;

arranging word lines in each optoelectronic device of the optoelectronic sensor array for applying a back-gate voltage to a specific row of optoelectronic devices in the array; and inputting corresponding voltages for the crossed optoelectronic devices in a specific column by using the bit lines and the word lines, meanwhile, inputting the back-gate voltage to corresponding optoelectronic devices through the word lines, completing partial convolution operation, and outputting the photocurrent I.

Figures 5, 6A:
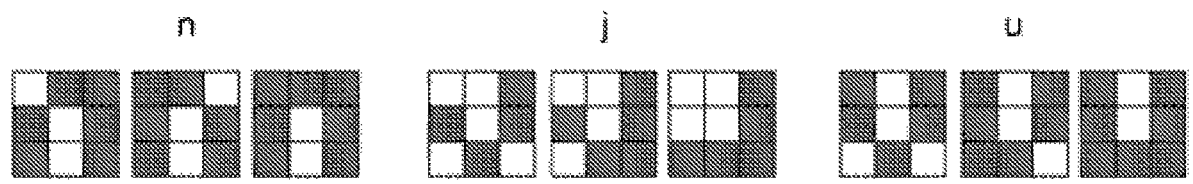
FIG. 5 shows different operations of the optoelectronic sensor array based on the retinomorphic optoelectronic device on image processing under different back-gate adjustments according to the present invention, which are sequentially from top to bottom: inverter, edge enhancement and contrast correction.
FIG. 6A is a schematic diagram of a process for training a convolutional neural network to achieve recognition of an image; the letters "N", "J" and "U" to be recognized by the array are shown in FIG. 6A.
Figure 6B:
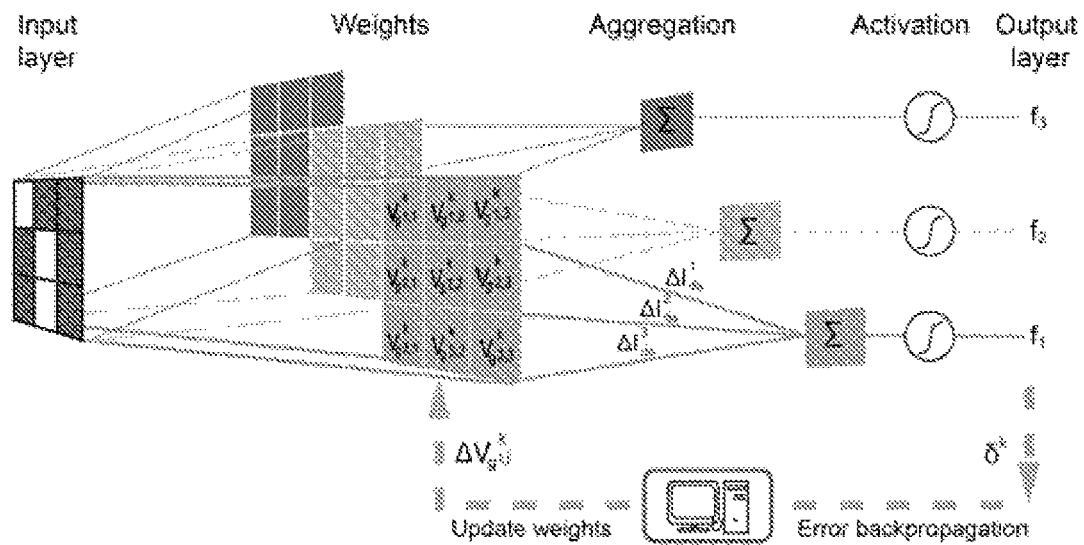
FIG. 6B shows three different convolution kernels are formed by training the photoresponse of each device in the optoelectronic sensor array in the manner.
Figure 6C:
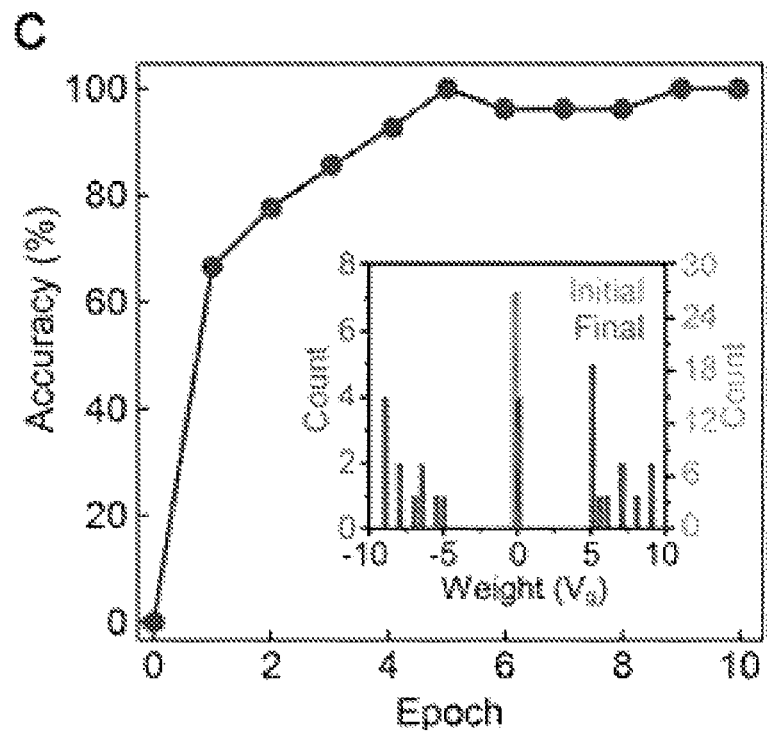
FIG. 6C shows a relation between average recognition rate and a number of trainings for these three letters.
Figure 6D:
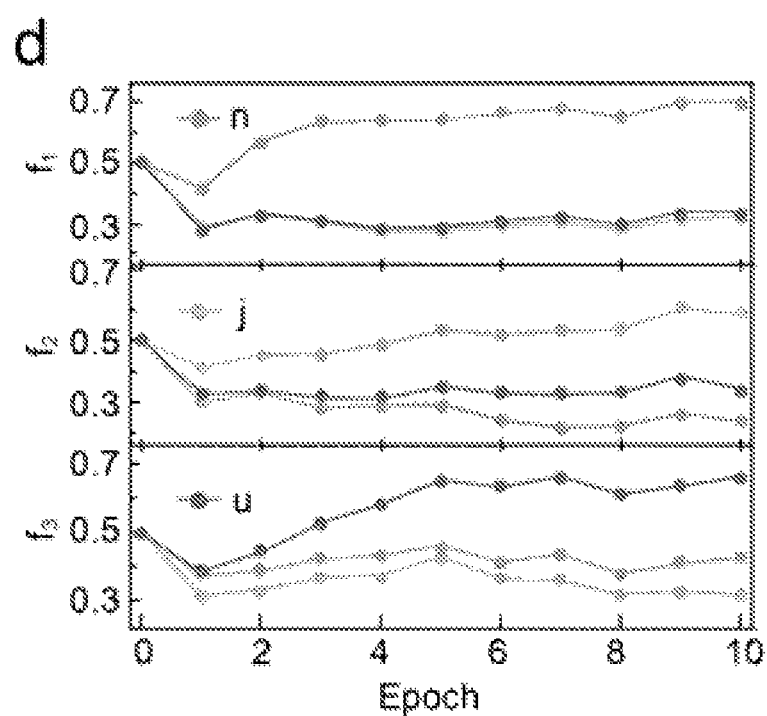
FIG. 6D shows the classification of three different writings for each of the three different classes of letters "N", "J" and "U"

FIG. 5 shows three different convolution operations, i.e., inverter, edge enhancement and contrast correction, performed on the inputted Lena image by using the convolution kernel implemented by a 3×3 optoelectronic sensor array as a prototype demonstration by using the method described in the above steps. It can be seen from the results that the result of convolution operation performed by the optoelectronic sensor array on the Lena image is similar to the simulation result using the same convolution kernel, which indicates the reconfigurable characteristic of the prototype optoelectronic sensor array in the visual information processing.

It should be noted that the above examples are laboratory experiment processes, corresponding adjustments are made according to corresponding production conditions in actual industrial production, and such modifications are within the scope of the present invention as long as they do not depart from the spirit of the present invention.

A visual image recognition method implemented according to a bionic retinomorphic optoelectronic sensor array comprises:

step 1, inputting information to be recognized into the optoelectronic sensor array, and setting back-gate voltages of all optoelectronic devices to be 0 V;

step 2, acquiring an output current I of the optoelectronic sensor array, and inputting the output current into the following Sigmoid activation function:

$$f=(1+e^{-\alpha I})^{-1}$$

wherein I is the output current of the optoelectronic sensor array, and a is a normalization coefficient;

step 3, after calculating a value of the activation function $f$, comparing the value with a target value, then determining and executing error back propagation operation according to the following equation:

$$\delta^k = f_g^k - f^k$$

wherein $\delta^k$ is an error used in a $k^{th}$ training, $f_g^k$ is a theoretical output value in the $k^{th}$ training, and $f^k$ is an output value of the Sigmoid activation function in the $k^{th}$ training;

step 4, after the error is transmitted to a first layer, updating an initial back-gate value in the optoelectronic sensor array through the following functional relationship:

$$\Delta V_g^k = \beta \times \text{round}(n^{-1} \times \text{conv}(P, \delta^k))$$

wherein n is a step length, β is a step length of a gate voltage change, P is an input of visual image information, round is a rounding function, and cony is a convolution function, and thus a training process is completed; and step 5, looping the steps 1-4 until the error calculated in the step 3 is close to or equal to 0, that is, a target image is successfully recognized from all the inputted images.

Specifically, the present optoelectronic sensor array consists of instance 1 in the device, is schematically shown in FIG. 6. The letters "N", "J" and "U" to be recognized by the array are shown in FIG. 6A, and three different convolution kernels are formed by training the photoresponse of each device in the optoelectronic sensor array in the manner shown in FIG. 6B, so as to recognizing the given letter in FIG. 6A. FIG. 6C shows a relation between average recognition rate and a number of trainings for these three letters, and the inset of FIG. 6C shows the distribution of back-gate values of a 3×3 device array after initialization and training are completed. FIG. 6D shows the classification of three different writings for each of the three different classes of letters "N", "J" and "U".

What is claimed is:

1. A process for using a retinomorphic sensor as an optoelectronic device, wherein the optoelectronic device is adopted in a visual convolution method for image processing comprising:

i) arranging bit lines in each optoelectronic device of an optoelectronic sensor array, connecting the bit lines corresponding to optoelectronic devices in each row in series, arranging signal lines on each optoelectronic device, connecting the signal lines corresponding to the optoelectronic devices in each column in series, and applying, by the bit lines and the signal lines, source and drain voltages to the optoelectronic sensor at a specific position in the array;

ii) arranging word lines in each optoelectronic device of the optoelectronic sensor array for applying a back-gate voltage to a specific row of the optoelectronic sensor in the array;

iii) inputting corresponding voltages for the crossed optoelectronic sensors in a specific column by using the bit lines and the word lines, meanwhile, inputting the back-gate voltage to corresponding optoelectronic devices through the word lines, completing partial convolution operation, and outputting a result, i.e., $$I_m = P_{11} \times G_{11}(V_g^{11}) + P_{21} \times G_{21}(V_g^{21}) + \ldots + P_{m1} \times G_{m1}(V_g^{m1})$$

wherein $V_g^{m1}$ is a back-gate voltage of an $m^{th}$ row and a $1^{st}$ column, $P_{m1}$ is a visual image information input of an optoelectronic device on the $m^{th}$ row and the $1^{st}$ column, $G_{m1}(V_g^{m1})$ is photo responsivity of the $m^{th}$ row and the $1^{st}$ column, and the m is a total number of rows of convolution kernels; and iv) completing convolution operation of the whole optoelectronic sensor array by using an m×m convolution kernel according to the method in the step (3).

2. The process according to claim 1, wherein the optoelectronic device is adopted in a visual image recognition method comprising:

step 1, inputting information to be recognized into the optoelectronic sensor array, and setting back-gate voltages of all optoelectronic devices to be 0 V;

step 2, acquiring an output current/of the optoelectronic sensor array, and inputting the output current into the following Sigmoid activation function:

$$f=(1+e^{-\alpha I})^{-1}$$

wherein I is the output current of the optoelectronic sensor array, and α is a normalization coefficient;

step 3, after calculating a value of the activation function $f$, comparing the value with a target value, then determining and executing error back propagation operation according to the following equation:

$$\delta^k = f_g^k - f^k$$

wherein $\delta^k$ is an error used in a $k^{th}$ training, $f_g^k$ is a theoretical output value in the $k^{th}$ training, and $f^k$ is an output value of the Sigmoid activation function in the $k^{th}$ training;

step 4, after the error is transmitted to the first layer, updating an initial back-gate value in the optoelectronic sensor array through the following functional relationship:

$$\Delta V_g^k = \beta \times \text{round}(n^{-1} \times \text{conv}(P, \delta^k))$$

wherein n is a step length, β is a step length of a gate voltage change, P is an input of visual image information, round is a rounding function, and conv is a convolution function, and thus a training process is completed; and step 5, looping the steps 1-4 until the error calculated in the step 3 is close to or equal to 0, that is, a target image is successfully recognized from all the inputted images.

3. The process according to claim 1, wherein the retinomorphic sensor has a vertically stacked heterostructure provided with a bottom electrode, a dielectric layer, a channel layer, a source electrode and a drain electrode on a base, wherein the source and drain electrode are mutually opposite and are arranged at two ends of the channel layer, the bottom electrode, the source and drain electrode are made of a material used by a flexible electrode, an inert metal or a semimetal, the dielectric layer is made of an insulating material and comprises a plurality of layers, the channel layer is made of a bipolar material, and the base comprises a substrate and an insulating material layer generated on a surface of the substrate.

4. The process according to claim 3, wherein the substrate is of a material comprising silicon, polyimide or polydimethylsiloxane, and the insulating material layer generated on the surface of the substrate is silicon oxide, aluminum oxide, hafnium zirconium oxygen or boron nitride.

5. The process according to claim 3, wherein the bipolar material of the channel layer is graphene, tungsten selenide, molybdenum telluride, black phosphorus or palladium selenide.

6. The process according to claim 3, wherein the dielectric layer is made of any one or more of boron nitride, silicon oxide, aluminum oxide and hafnium zirconium oxygen.

7. The process according to claim 3, wherein the retinomorphic sensor is prepared by the following steps:
   S1, preparing the bottom electrode on a surface of the base;
   S2, directly obtaining the dielectric layer on the bottom electrode, or firstly obtaining dielectric layer materials on the bottom electrode, and then vertically stacking the dielectric layer materials by using a material transfer method to prepare the dielectric layer having a multilayer structure;
   S3, performing direct generation of the bipolar material of the channel layer on the dielectric layer; or firstly obtaining the bipolar material of the channel layer, and then transferring the bipolar material onto the dielectric layer by using a material transfer method to form the channel layer; and
   S4, preparing the source and drain electrode on a surface of the channel layer.

8. The process according to claim 7, wherein, in the S2, the method for directly obtaining the dielectric layer on the bottom electrode is a chemical vapor deposition method, a chemical vapor transport method, a molecular-beam epitaxy method, an atomic layer deposition method or a hydrothermal method.

9. The process according to claim 7, wherein, in the S3, the method for performing the direct generation of the bipolar material of the channel layer on the dielectric layer is a chemical vapor deposition method, a chemical vapor transport method, a molecular-beam epitaxy method, an atomic layer deposition method or a hydrothermal method.

10. The process according to claim 7, wherein, in the S1, the method for preparing the bottom electrode on a surface of the base comprises:
   S11, preparing a designed bottom electrode shape on the substrate by adopting an ultraviolet photo lithography method, an electron beam lithography method or a mask method; and
   S12, preparing the bottom electrode.

* * * * *